United States Patent
Guo et al.

(10) Patent No.: US 8,077,267 B2
(45) Date of Patent: Dec. 13, 2011

(54) TFT LCD ARRAY SUBSTRATE WHEREIN AN AIR GAP IS FORMED BETWEEN THE INSULATING LAYER AND THE ACTIVE LAYER AND METHOD OF MANUFACTURING THEREOF

(75) Inventors: Jian Guo, Beijing (CN); Wei Wang, Beijing (CN); Kiyong Kim, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 77 days.

(21) Appl. No.: 12/126,280

(22) Filed: May 23, 2008

(65) Prior Publication Data
US 2009/0027604 A1    Jan. 29, 2009

(30) Foreign Application Priority Data
Jul. 26, 2007   (CN) .......... 2007 1 0119563

(51) Int. Cl.
G02F 1/136    (2006.01)
G02F 1/1333   (2006.01)
(52) U.S. Cl. .......... 349/43; 349/138

(58) Field of Classification Search .......... 349/42, 349/43, 138
See application file for complete search history.

(56) References Cited

U.S. PATENT DOCUMENTS

| | | | |
|---|---|---|---|
| 6,188,108 B1 * | 2/2001 | Yoon et al. | 257/347 |
| 7,167,218 B1 * | 1/2007 | Park et al. | 349/44 |
| 2007/0153152 A1 * | 7/2007 | Wang et al. | 349/43 |

FOREIGN PATENT DOCUMENTS
KR   2003-0021744 A   3/2003
* cited by examiner

Primary Examiner — Mark Robinson
Assistant Examiner — Dennis Y Kim
(74) Attorney, Agent, or Firm — Ladas & Parry, LLP

(57) ABSTRACT

Provided are a thin film transistor liquid crystal array substrate and a method of manufacturing the same. The thin film transistor liquid crystal display array substrate includes: a substrate, a gate scanning line and a signal scanning line formed on the substrate and intersecting each other, an insulating layer and an active layer formed between the gate scanning line and the signal scanning line, wherein an air gap is formed between the insulating layer and the active layer at the intersection of the gate scanning line and the signal scanning line.

17 Claims, 4 Drawing Sheets

TFT LCD ARRAY SUBSTRATE WHEREIN AN AIR GAP IS FORMED BETWEEN THE INSULATING LAYER AND THE ACTIVE LAYER AND METHOD OF MANUFACTURING THEREOF

CROSS-REFERENCE TO RELATED APPLICATIONS

This application corresponds to Chinese Patent Application No. 200710119563.2, filed on Jul. 26, 2007, which is incorporated herein in its entirety.

BACKGROUND OF THE INVENTION

The present invention relates to a thin film transistor liquid crystal display (TFT-LCD), and in particular, to a TFT LCD array substrate and a method of manufacturing the same.

Due to the advantages of small volume, low power consumption, no radiation and the like, a TFT LCD is becoming dominant in the market of flat panel displays. A TFT LCD is formed by bonding together an array substrate and a color filter substrate opposing to each other. On the array substrate, at least one gate scanning line and at least one signal scanning line intersecting each other to define pixel units are provided, and a pixel electrode and a thin film transistor are provided in each pixel unit. A driving signal is applied through the gate scanning line, and an image data signal is applied to the pixel electrode through the signal scanning line. A black matrix is provided on the color filter substrate, so that light cannot transmit through the areas surrounding the pixel electrodes on the array substrate. A color filter layer is provided corresponding to each pixel area, and on the color filter layer a common electrode is provided. Liquid crystal is filled between the array substrate and the color filter substrate bonded together, and the orientation of liquid crystal can be controlled by the voltage applied across the pixel electrode and the common electrode, so that the transmittance of light is controlled, and with the color filter layer, the color image information can be displayed.

Currently, the gate scanning line and the signal scanning line in a TFT LCD array substrate intersect each other and are separated with an insulating layer and an active layer. That is to say, in the manufacturing process of the TFT LCD, the active layer is deposited on the insulating layer directly, and then the signal scanning line is formed above the active layer. The components of each pixel, such as the gate scanning line, the signal scanning line, the common electrode, and the like, are all formed on the same array substrate and the distance among them is small; therefore, capacitance is easy to be generated among these components. The parasitic capacitance between the gate scanning line and the signal scanning line generates the substantial influence. Since parasitic capacitance generally is not uniformly distributed across the whole panel, storage capacitance for each pixel unit varies accordingly, which in turn renders color distribution over the whole screen not uniform, so that the display quality is degraded. As the size of a TFT LCD is continuously increased, the signal delay on the signal scanning line due to the capacitance effect (RC delay) become serious, so that the time for charging and discharging of the pixel electrodes is seriously restricted, which limits the enhancement of the response rate of the TFT LCD. Furthermore, during manufacturing of the array substrate, electrostatic discharging (ESD) tends to occur at the positions where the gate scanning line and the signal scanning line intersect each other. Electrostatic gradually accumulates during the manufacturing process, and finally the insulating layer and the active layer for separating the gate scanning line and the signal scanning line are subject to breakdown, giving rise to short circuit between the gate scanning line and the signal scanning line and thus bright line on the panel.

SUMMARY OF THE INVENTION

The first aspect of the invention provides a TFT LCD array substrate, and the second aspect of the invention provides a method of manufacturing the TFT LCD array substrate.

An embodiment of the invention provides a thin film transistor liquid crystal display (TFT LCD) array substrate, comprising: a substrate, a gate scanning line and a signal scanning line formed on the substrate and intersecting each other, and an insulating layer and an active layer formed between the gate scanning line and the signal scanning line, wherein an air gap is formed between the insulating layer and the active layer at the intersection of the gate scanning line and the signal scanning line.

The implementation of the embodiment of the invention can have the one or more advantages of reducing the parasitic capacitance, the signal scanning line signal delay, avoiding the short circuit between the gate scanning line and the signal scanning line and the ESD phenomenon, and therefore enhancing the display quality.

Another embodiment of the invention provides an method of manufacturing a thin film transistor liquid crystal display array substrate, comprising the steps of: depositing a first metal film on the substrate and patterning the first metal film to form a gate scanning line; depositing an insulating layer on the substrate; applying a photoresist layer on the substrate and patterning the photoresist layer so that the photoresist is remained at the intersection of the gate scanning line and a signal scanning line to be formed; depositing an active covering layer on the substrate and patterning the active covering layer so as to form an active layer partially covering the remained photoresist in a direction of the gate scanning line; lifting off the remained photoresist between the insulating layer and the active layer, whereby an air gap is formed between the insulating layer and the active layer; and depositing a second metal film on the substrate and patterning the second metal film to form the signal scanning line.

Implementation of the method of manufacturing the TFT LCD array substrate according to the embodiment of the invention, the yield of products may be improved and the display quality of the product can be enhanced.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION OF THE PREFERRED EMBODIMENTS

Exemplary embodiments of the present invention will be described hereinafter with reference to the accompanying drawings. It should be understood that in this description when a layer or a element is referred to as being "on" or "connected to" another layer or element, this layer or element can be directly on or directly connected to the other layer or element, or an intervening layer may also be present.

The First Embodiment

Figure 1:
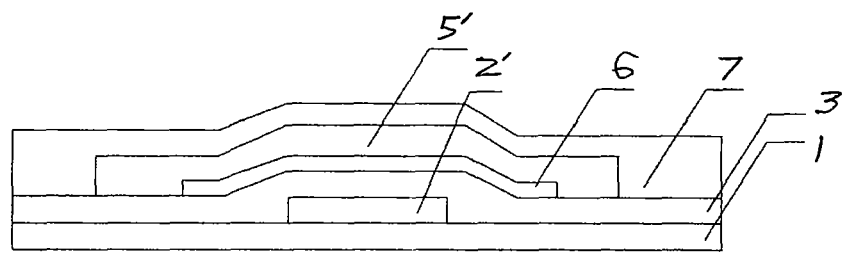
FIG. 1 is a schematic view of an array substrate having an air gap according to an embodiment of the invention.

FIG. 1 is a schematic view of an array substrate having an air gap according to an embodiment of the invention. As shown in FIG. 1, a TFT LCD array substrate comprises a substrate 1, a gate scanning line 2' and a signal scanning line 7 formed on the substrate 1 and intersecting each other to define a pixel unit, an insulating layer 3 and an active layer 5 formed between the gate scanning line 2' and the signal scanning line 7, and an air gap 6 provided between the insulating layer 3 and the active layer 5 at the position where the gate scanning line and the signal scanning line intersect each other.

On the substrate 1, there are formed the gate scanning line 2', the insulating layer 3, the air gap 6, the active layer 5', and the signal scanning line 7 in order. The formed air gap 6 has the same wideness in the direction of the gate scanning line 2' as that of the active layer 5, and has the same wideness in the direction of the signal scanning line 7 as that of the gate scanning line 2'. The height of the air gap 6 may be appropriately selected so as to avoid any substantive projection on the formed structure, and the height is selected to properly separate the gate scanning line and the signal scanning line.

The array substrate with the air gap according to the embodiment generates small parasitic capacitance since the dielectric constant of the air is smaller than that of the silicon and silicon oxide. Furthermore, since the air gap increases the distance between the gate scanning line and the signal scanning line, further reducing the parasitic capacitance; therefore, the array substrate according to the embodiment not only can reduce the capacitance between the gate scanning line and the signal scanning line, but also can reduce the signal delay of the signal scanning line due to RC delay and increase response rate. In addition, the probability of undesirable occurrence of ESD and the like at the intersection of the gate scanning line and the signal scanning line can be reduced, and the display quality can be improved.

The TFT LCD array substrate according to the embodiment of the invention may be manufactured by a following method. The cross-sectional views of FIGS. 2a~7 are also taken at the position corresponding to that indicated by line I-I in FIG. 10.

Figure 2A:
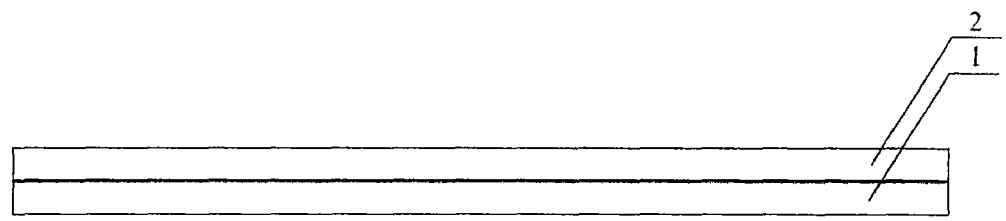
FIG. 2a is a schematic view of depositing a gate metal film on the substrate.
Figure 2B:
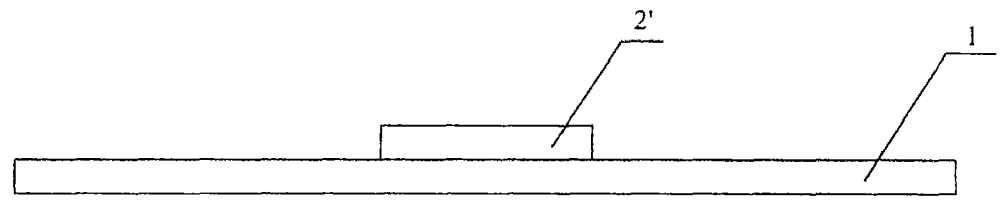
FIG. 2b is a schematic view of forming a gate scanning line on the substrate.

First, as shown in FIG. 2a, a layer of gate metal film 2 is deposited on a substrate 1 for example by magnetron sputtering, and the material of the gate metal film may be selected from the group consisting of molybdenum, aluminum, aluminum-nickel alloy, molybdenum-tungsten alloy, chromium, copper, and the combination thereof. As shown in FIG. 2b, a gate scanning line 2' is formed on the substrate 1 by lithography process and etching process with respect to the gate metal film 2.

Figure 3:
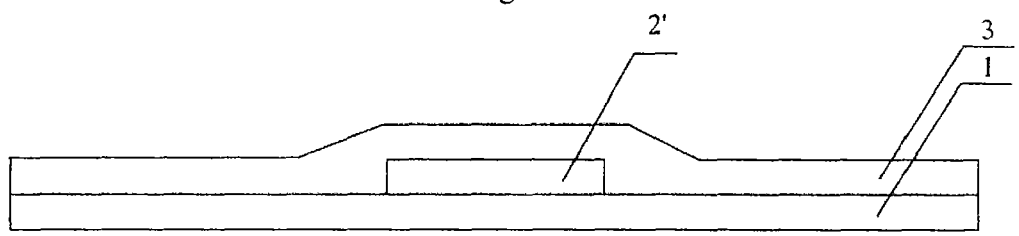
FIG. 3 is a schematic view of depositing an insulating layer on the substrate.

Then, as shown in FIG. 3, an insulating layer 3 is deposited on the substrate 1 formed with the gate scanning line 2'. The material of the insulating layer may be selected from the group consisting of silicon nitride, silicon oxide, and silicon oxynitride.

Figure 4A:
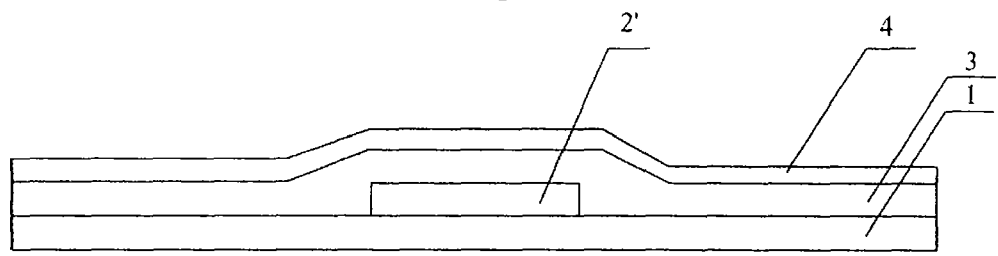
FIG. 4a is a schematic view of applying photoresist on the substrate.
Figure 4B:
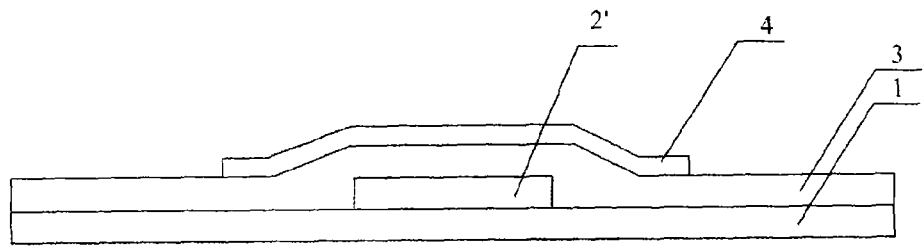
FIG. 4b is a schematic view of the photoresist after lithography process.

Next, as shown in FIG. 4a, on the substrate formed with insulating layer 3, a photoresist layer 4 is applied on the substrate. As shown in FIG. 4b, the photoresist layer on the intersection of a gate scanning line and a signal scanning line is left with lithography process, and the photoresist covers the gate scanning line 2' in the direction perpendicular to the direction of the gate scanning line 2'. The width of the remained photoresist is larger than that of the gate scanning line 2', and there is no remained photoresist on other positions on the substrate 1.

Figure 5A:
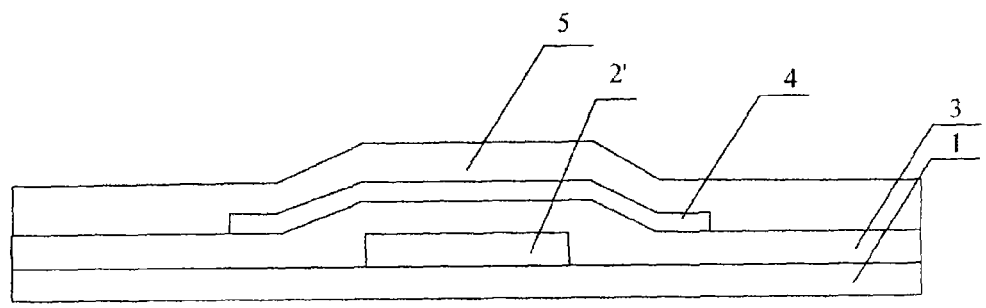
FIG. 5a is a schematic view of depositing an active layer on the substrate.
Figure 5B:
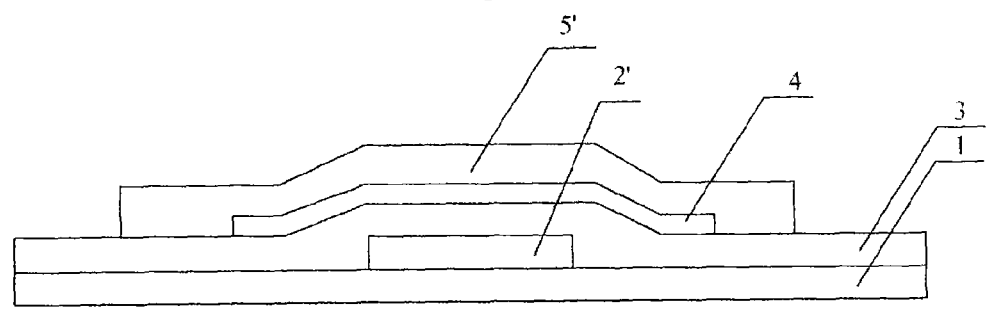
FIG. 5b is a schematic view of the active layer after lithography and etching process.

Next, as shown in FIG. 5a, an active covering layer 5 is further deposited on the substrate 1 with the above formed structure. As shown in FIG. 5b, after deposition of the active covering layer 5, with lithography process and etching process, besides the active layer remained at the positions on the array such as those for forming thin film transistors on the substrate, the active layer 5' is formed at the position where the photoresist 4 is left, and the formed active layer 5' partially covers the remained photoresist 4 in the direction of the gate scanning line 2'.

Figure 6:
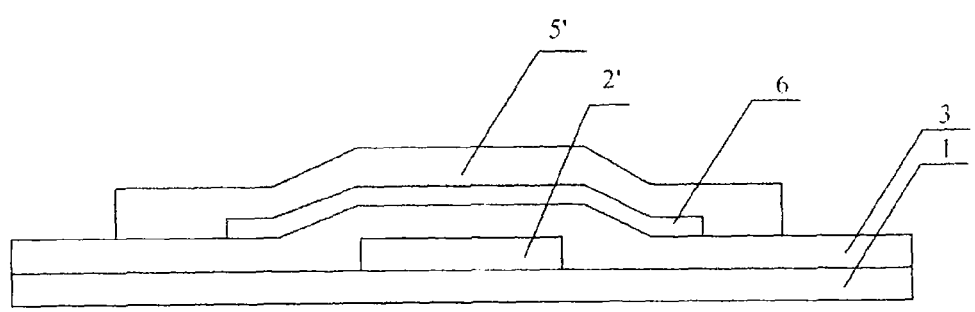
FIG. 6 is a schematic view of forming an air gap by a lifting-off process.

Next, as shown in FIG. 6, the photoresist 4 between the insulating layer 3 and the active layer 5' is lifted off by lifting-off process. In the lifting-off process, the photoresist 4 is normally lifted off by the treatment on the substrate with an acid solution. After the photoresist 4 is lifted off, an air gap 6 is formed between the insulating layer 3 and the active layer 5'. At the same time, the active layer 5' is remained for support purpose.

Figure 7:
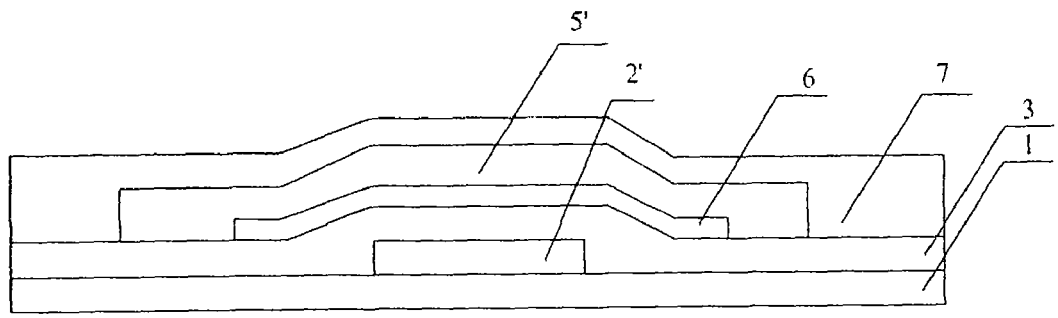
FIG. 7 is a schematic view of forming a signal scanning line on the air gap.

Finally, as shown in FIG. 7, after the air gap 6 is formed, a metal film is deposited on the whole substrate with the above formed structure, and a signal scanning line 7 is formed using the method similar to that of forming the gate scanning line 2. The signal scanning line 7 is formed on the active layer 5' having the air gap 6 below and is provided perpendicularly to the gate scanning line 2', that is, intersect the gate scanning line 2'.

The Second Embodiment

Figure 8:
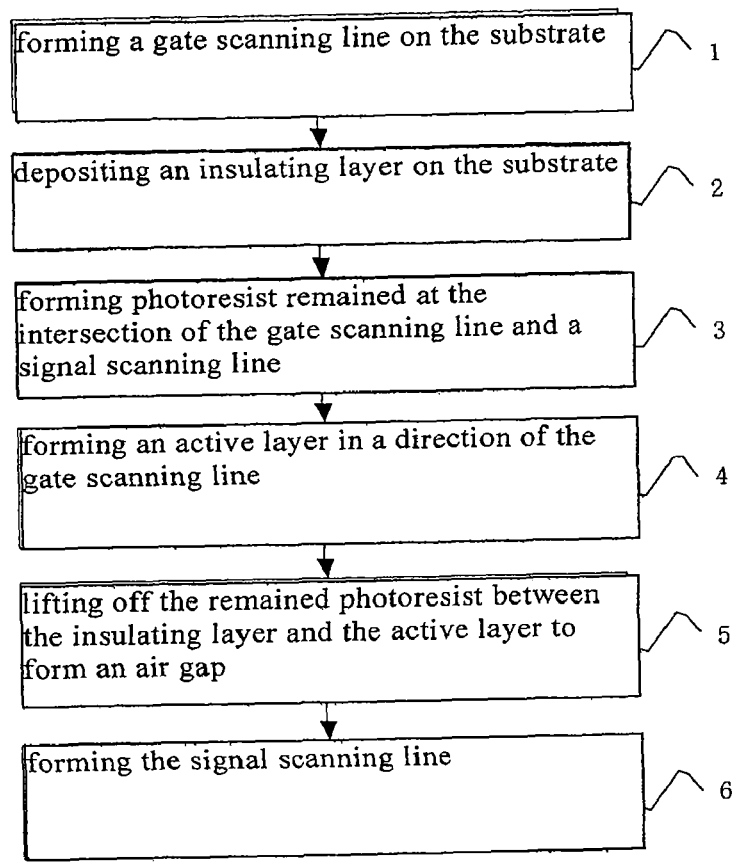
FIG. 8 is a schematic view of the manufacturing processes of the array substrate according to an embodiment of the invention.

As shown in FIG. 8, the embodiment according to the invention provides a method for manufacturing an array substrate having an air gap. The method comprises the following steps of:

step 1, a metal film is deposited and patterned on a substrate, and a gate scanning line is formed by lithography process and etching process;

step 2, an insulating layer is deposited on the substrate;

step 3, a photoresist layer is applied and patterned on the insulating layer on the substrate, and the photoresist is remained at the intersection of the gate scanning line and a signal scanning line, which is to be formed subsequently, after lithography process and etching process;

step 4, an active covering layer is deposited and patterned on the substrate by the lithography and etching process so that there are formed an active layer of a thin film transistor and an active layer partially covering the remained photoresist in a direction of the gate scanning line at the intersection of the gate scanning line and a signal scanning line, which is to be formed subsequently;

step 5, the remained photoresist between the insulating layer and the active layer is lifted off by lifting-off process, and thus a air gap is formed between the insulating layer and the active layer; and step 6, a metal film is deposited on the substrate and patterned to form a signal scanning line by the lithography and etching process, and the signal scanning line is formed above the active layer over the air gap and intersect the signal scanning line.

Figure 9:
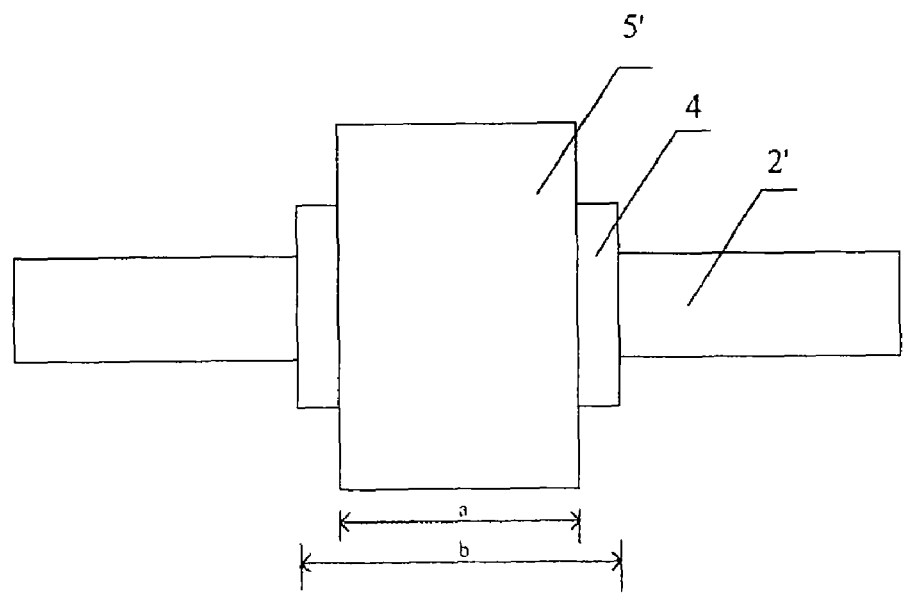
FIG. 9 is a schematic top view of the lifting-off process.
Figure 10:
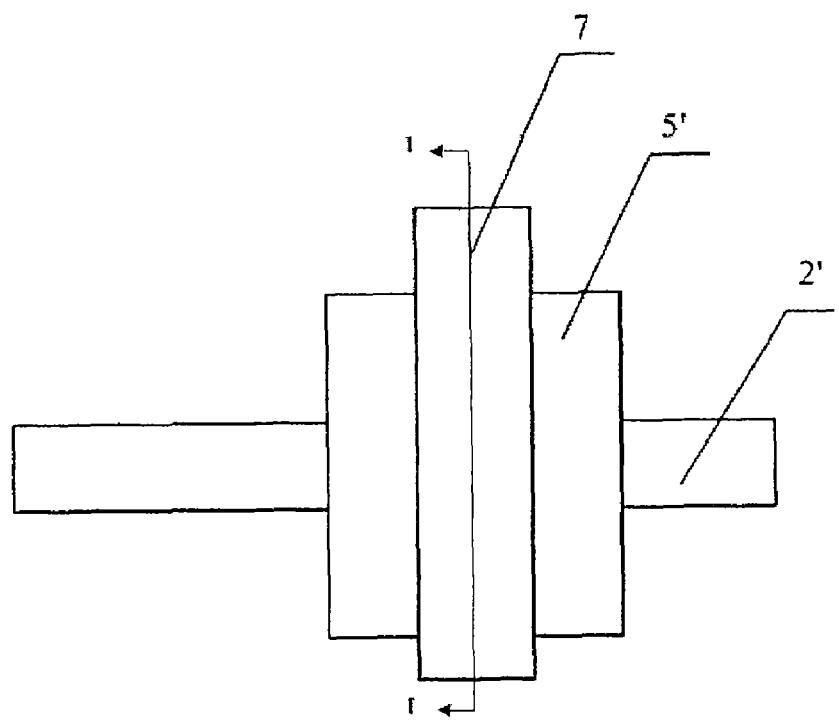
FIG. 10 is a schematic top view of forming the signal scanning line after the lifting-off process according to the embodiment of the invention.

In the conventional TFT LCD process, the active covering layer is deposited on the insulating layer directly, and then the metal film for forming the signal scanning line is formed on the active layer. In the embodiment of the invention, in order to form the air gap between the insulating layer and the active layer, after the deposition of the insulating layer is completed, a photoresist layer is applied at the intersection of the gate scanning line and the signal scanning line. The thickness of the applied photoresist preferably is appropriately selected so as to avoid large projection on the surface of the finished array substrate. After application of the photoresist on the substrate, the desired pattern of the photoresist layer is formed on the substrate by exposure and development and some photoresist is remained at the intersections of the gate scanning line and the signal scanning line. Subsequently, after the active covering layer is deposited, the desired pattern of the active covering layer is formed by lithography and etching, including the active layer that is remained at position for the thin film transistor and at the position above the remained photoresist. As shown in FIGS. 9 and 10, in the direction perpendicular to the direction of the gate scanning line 2', the active layer 5' is preferably longer than the remained photoresist 4 for supporting. At the same time, the widths of the photoresist 4 and the active layer 5' are also preferably larger than that of the gate scanning line 2' so as to separate the gate scanning line and the signal scanning line in space. In the direction of the gate scanning line 2', the width of the photoresist 4 can be larger than that of the active layer 5', so as to avoid the situation that photoresist is covered by the active layer 5' and cannot be lifted off in the subsequent processes. In FIG. 9, "a" is the width of the active layer 5' in the direction of the gate scanning line 2', and "b" is the width of the photoresist 4 in the direction of the gate scanning line 2'. The active layer 5' is obtained from the active covering layer 5, and there is a relationship of "b>a." After the photoresist 4 is lifted off, the air gap 6 is formed between the insulating layer and the active layer 5', and the signal scanning lien 7 is formed at the intersection with the gate scanning line 2' on the active layer 5' over the air gap 6.

With respect to the active layer, the thickness of the air gap 6 is relatively small, and the surface of the TFT LCD panel may not be affected substantially. On the other hand, the capacitance between the gate scanning line and the signal scanning line can be reduced, and the probability of generating ESD is decreased. The display quality and the product yield can be improved.

The above embodiments are only provided in illustration, other methods or materials can be used to implement the invention, and these variations should be within the spirit and scope of the invention.

The embodiments of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A thin film transistor liquid crystal display (TFT LCD) array substrate, comprising:
    a substrate,
    a gate scanning line and a signal scanning line formed on the substrate and intersecting each other, and
    an insulating layer and an active layer formed at the intersection of the gate scanning line and the signal scanning line wherein at least a portion of the insulating layer and at least a portion of the active layer are layered between the gate scanning line and the signal scanning line,
    wherein an air gap is formed between the insulating layer and the active layer at the intersection of the gate scanning line and the signal scanning line.

2. The TFT LCD array substrate of claim 1, wherein the width of the air gap is equal to the width of the active layer in the direction of the gate scanning line.

3. A method of manufacturing the TFT LCD array substrate of claim 2, the method comprising:
    depositing a first metal film on the substrate and patterning the first metal film to form a gate scanning line;
    depositing an insulating layer on the substrate;
    applying a photoresist layer on the substrate and patterning the photoresist layer so that the photoresist is remained at the intersection of the gate scanning line and a signal scanning line to be formed;
    depositing an active covering layer on the substrate and patterning the active covering layer so as to form an active layer partially covering the remained photoresist in a direction of the gate scanning line;
    lifting off the remained photoresist between the insulating layer and the active layer, whereby an air gap is formed between the insulating layer and the active layer; and
    depositing a second metal film on the substrate and patterning the second metal film to form the signal scanning line.

4. The method of claim 3, wherein applying a photoresist layer on the substrate and patterning the photoresist layer comprises: in the direction perpendicular to the gate scanning line, the width of the remained photoresist is larger than that of the gate scanning layer.

5. The method of claim 3, wherein depositing an active covering layer on the substrate and patterning the active covering layer comprises:
    in the direction of the gate scanning line, the width of the active layer is less than that of the remained photoresist.

6. The TFT LCD array substrate of claim 1, wherein the width of the air gap is equal to the width of the gate scanning line in the direction of the signal scanning line.

7. A method of manufacturing the TFT LCD array substrate of claim 1, the method comprising:
    depositing a first metal film on the substrate and patterning the first metal film to form a gate scanning line;

depositing an insulating layer on the substrate;

applying a photoresist layer on the substrate and patterning the photoresist layer so that the photoresist is remained at the intersection of the gate scanning line and a signal scanning line to be formed;

depositing an active covering layer on the substrate and patterning the active covering layer so as to form an active layer partially covering the remained photoresist in a direction of the gate scanning line;

lifting off the remained photoresist between the insulating layer and the active layer, whereby an air gap is formed between the insulating layer and the active layer; and depositing a second metal film on the substrate and patterning the second metal film to form the signal scanning line.

8. The method of claim 7, wherein applying a photoresist layer on the substrate and patterning the photoresist layer comprises:

in the direction perpendicular to the gate scanning line, the width of the remained photoresist is larger than that of the gate scanning layer.

9. The method of claim 7, wherein depositing an active covering layer on the substrate and patterning the active covering layer comprises:

in the direction of the gate scanning line, the width of the active layer is less than that of the remained photoresist.

10. The TFT LCD array substrate of claim 1, wherein the width of the air gap is equal to one selected from the width of the active layer in the direction of the gate scanning line and the width of the gate scanning line in the direction of the signal scanning line.

11. A method of manufacturing the TFT LCD array substrate of claim 10, the method comprising:

depositing a first metal film on the substrate and patterning the first metal film to form a gate scanning line;

depositing an insulating layer on the substrate;

applying a photoresist layer on the substrate and patterning the photoresist layer so that the photoresist is remained at the intersection of the gate scanning line and a signal scanning line to be formed;

depositing an active covering layer on the substrate and patterning the active covering layer so as to form an active layer partially covering the remained photoresist in a direction of the gate scanning line;

lifting off the remained photoresist between the insulating layer and the active layer, whereby an air gap is formed between the insulating layer and the active layer; and depositing a second metal film on the substrate and patterning the second metal film to form the signal scanning line.

12. The method of claim 11, wherein applying a photoresist layer on the substrate and patterning the photoresist layer comprises: in the direction perpendicular to the gate scanning ling, the width of the remained photoresist is larger than that of the gate scanning layer.

13. The method of claim 11, wherein depositing an active covering layer on the substrate and patterning the active covering layer comprises:

in the direction of the gate scanning line, the width of the active layer is less than that of the remained photoresist.

14. A thin film transistor liquid crystal display (TFT LCD) array substrate, comprising:

a substrate, a gate scanning line and a signal scanning line formed on the substrate and intersecting each other, and an insulating layer and an active layer formed at the intersection of the gate scanning line and the signal scanning line between the gate scanning line and the signal scanning line, wherein an air gap is formed between the insulating layer and the active layer at the intersection of the gate scanning line and the signal scanning line, and wherein the gate scanning line and the signal scanning line intersect at the position where the air gap is formed and both the gate scanning line and the signal scanning line extend across the air gap.

15. The TFT LCD array substrate of claim 14, wherein the width of the air gap is equal to the width of the active layer in the direction of the gate scanning line.

16. The TFT LCD array substrate of claim 14, wherein the width of the air gap is equal to the width of the gate scanning line in the direction of the signal scanning line.

17. A thin film transistor liquid crystal display (TFT LCD) array substrate, comprising:

a substrate, a gate scanning line and a signal scanning line formed on the substrate and intersecting each other, and an insulating layer and an active layer formed at the intersection of the gate scanning line and the signal scanning line wherein at least a portion of the active layer is layered between the gate scanning line and the signal scanning line, wherein:

an air gap is formed between the insulating layer and the active layer at the intersection of the gate scanning line and the signal scanning line; and the width of the air gap is equal to the width of the gate scanning line in the direction of the signal scanning line.

* * * * *